US006983789B2

(12) United States Patent
Jenkins et al.

(10) Patent No.: US 6,983,789 B2
(45) Date of Patent: Jan. 10, 2006

(54) SYSTEM AND METHOD FOR PROVIDING COOLING SYSTEMS WITH HEAT EXCHANGERS

(75) Inventors: Kurt A. Jenkins, Olympia, WA (US); John G. Olendorf, Portland, OR (US); Peter Davison, Puyallup, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/112,049

(22) Filed: Apr. 22, 2005

(65) Prior Publication Data

US 2005/0183850 A1 Aug. 25, 2005

Related U.S. Application Data

(62) Division of application No. 10/104,526, filed on Mar. 22, 2002, now Pat. No. 6,926,070.

(51) Int. Cl.
*F28F 7/00* (2006.01)

(52) U.S. Cl. .................. 165/80.3; 165/80.4; 165/80.5; 165/104.33; 165/121; 165/122; 165/150; 165/185; 165/905; 165/79; 361/695; 361/699

(58) Field of Classification Search .................. 165/58, 165/61, 76, 121, 177, 179, 180, 150, 79, 165/151, 905, 80.3–80.5, 104.21, 182, 185, 165/173, 47, 137, 122, 104.33; 361/699, 361/695

See application file for complete search history.

(56) References Cited

U.S. PATENT DOCUMENTS

| 4,926,933 | A | 5/1990 | Gray |
| 5,183,101 | A | 2/1993 | Penaluna et al. |
| 5,368,094 | A | 11/1994 | Hung |
| 5,482,113 | A | 1/1996 | Agonafer et al. |
| 5,940,270 | A | 8/1999 | Puckett |
| 6,003,319 | A | 12/1999 | Gilley et al. |
| 6,026,888 | A | 2/2000 | Moore |
| 6,044,901 | A | 4/2000 | Basala |
| 6,166,907 | A | 12/2000 | Chien |
| 6,367,542 | B1 | 4/2002 | Chen |
| 6,377,219 | B2 | 4/2002 | Smith |
| 6,397,941 | B1 | 6/2002 | McCullough |
| 6,926,070 | B2 * | 8/2005 | Jenkins et al. ................. 165/79 |

FOREIGN PATENT DOCUMENTS

| JP | 2000-121204 | | 4/2000 |
| JP | 2001015662 | A * | 1/2001 |

* cited by examiner

*Primary Examiner*—John K. Ford
(74) *Attorney, Agent, or Firm*—Pillsbury Winthrop Shaw Pittman LLP

(57) ABSTRACT

A cooling system is provided with a heat exchanger that has a thermally conductive tube over-molded with a plurality of thermally conductive fins. To form the heat exchanger, a thermally conductive tube is provided. Insert molding, over molding or injection molding is utilized to incorporate thermally conductive fins with the thermally conductive tubes. The molding process may also simultaneously create any required features, such as mounting features and fittings for tubing to be connected to the heat exchanger.

7 Claims, 8 Drawing Sheets

SYSTEM AND METHOD FOR PROVIDING COOLING SYSTEMS WITH HEAT EXCHANGERS

RELATED APPLICATIONS

This application is a divisional application of U.S. patent application Ser. No. 10/104,526, filed Mar. 22, 2002, now U.S. Pat. No. 6,926,070, issued Aug. 9, 2005.

BACKGROUND OF THE INVENTION

1. Field of the Invention

The present invention generally relates to cooling systems. More specifically, the present invention relates to a system and method for providing cooling systems with heat exchangers, wherein the cooling system is preferably a liquid cooling system that lowers the temperature of an integrated circuit package or surfaces of semiconductor devices.

2. Discussion of the Related Art

In recent years, electronic devices and systems have been made to operate with faster and faster speed. Rapid development in high power integrated circuit (IC) chips, such as high-end processors or processors for high power systems, are made to meet the increasing demands on fast performance and decrease size of electronic systems. The demands have led to a decrease in the size and weight of chips, while at the same time the number of elements on the chips has grown considerably. This leads to increase in heat generation.

Generally, there are two categories of cooling mechanisms for an electronic system: air cooling and liquid cooling. Air cooling has the advantage of being relatively inexpensive and easy to incorporate into most system designs. Air cooling is implemented for most of the low to medium power electronic systems, and it is further divided into natural convection cooling and forced convention cooling. Natural convection cooling is usually implemented for extremely low power systems, where thermal density variations caused by heating of the systems induce air movement sufficient to carry away excess heat. On the other hand, for systems with higher power levels, forced convection cooling is utilized with a fan or blower that creates air flow, which enhances heat transfer coefficients and increases the amount of heat dissipation.

As the performance of the IC chips become faster and the elements on the IC chips become denser, power dissipation and heat generation by the IC chips increases. While air cooling is sufficient for most low to medium power electronic systems, the increase in heat generation in high power electronic systems and high-end processors is driving a requirement for liquid cooling solutions. Two types of liquid cooling are generally implemented: direct liquid cooling and indirect liquid cooling. In direct liquid cooling, the chips come in direct contact with the coolant, whereas in indirect liquid cooling, heat transfer is accomplished via an indirect manner and the chips do not come in contact with the coolant. Instead, a heat exchanger may be implemented to remove heat from the liquid, indirectly removing heat from the chips. Of the two types of liquid cooling mechanisms, direct liquid cooling is by far the most effective, but it runs into the problems of selecting an electrically nonconductive coolant and degradation of coolant because of chemical reactions. On the other hand, the current method of implementing an indirect liquid cooling involves complicated and time-consuming manufacturing processes, making it expensive for mainstream applications to adapt liquid cooling solutions as means of dissipating heat.

One of the complicated and time-consuming manufacturing processes is associated with the making of a heat exchanger that is specifically adapted for a liquid cooling system. A heat exchanger serves to radiate heat from the liquid flowing therethrough. FIG. 1 shows a top view of a prior art design of a heat exchanger 9 in a liquid cooling system. The prior art heat exchanger 9 is made of metal, and it comprises vertical metal fins 5, metal base tubes 3 and tube elbows 7. The prior art heat exchanger 9 is connected to tubing 1, which carries hot liquid generated from one portion of the liquid cooling system into the metal base tubes 3. The tube elbows 7 connect neighboring metal base tubes 3 with one another, allowing hot liquid to flow readily through all the metal base tubes 3 of the prior art heat exchanger 9. The vertical metal fins 5 run through the metal base tubes 3, serving to more efficiently radiate heat from the hot liquid as it flows through the metal base tubes 3. Thus, the metal base tubes 3 conducts hot liquid through an array of the horizontal metal fins 5 through a series of bends 7. A metal frame 8 is also assembled over the metal fins 5 to provide additional strength and mounting features.

FIG. 2 illustrates a perspective view of the prior art heat exchanger 9 with horizontal metal fins 5. To form the prior art heat exchanger 9, the metal fins 5 need to be first formed and then assemble onto the metal base tubes 3. The manufacturing and assembly require a number of steps to be performed. For example, stamping is needed to form thin metal fins. Additionally, holes 4 need to be introduced in the metal fins 5 to allow tube insertion of the metal base tubes 3 through the metal fins 5. To provide proper seal, the metal fins 5 are then either pressed fit or brazed to the metal base tubes 3. Sometimes, the metal base tubes 3 are required to be inserted through the metal fins 5 prior to the tube elbows 7 being soldered into place, which further complicates the assembly process. Furthermore, mounting features, such as brackets and screw holes, need to be assembled onto the subassembly as a final step. These manufacturing and assembly processes are complicated and time-consuming, making the prior art heat exchanger 9 expensive to make and labor intensive and not scalable to high volume manufacturing (HVM).

Therefore, there is a need for a new system and method of providing liquid cooling system that is less complicated to construct, which would be less expensive by being machine intensive instead of labor intensive in high volume manufacturing.

BRIEF DESCRIPTION OF THE DRAWINGS

The accompanying drawings, which are incorporated in and form a part of this specification, illustrate embodiments of the present invention and, together with the description, serve to explain the principles of the present invention.

DETAILED DESCRIPTION

Reference will now be made to the preferred embodiments of the invention, examples of which are illustrated in the accompanying drawings. While the present invention will be described in conjunction with the preferred embodiments, it will be understood that they are not intended to limit the invention to these embodiments. On the contrary, the present invention is intended to cover alternatives, modifications and equivalents, which may be included within the spirit and scope of the invention as defined by the appended claims. Moreover, in the following detailed description of the present invention, numerous specific details are set forth in order to provide a thorough understanding of the present invention. However, the present invention may be practiced without these specific details. In other instances, well-known methods, procedures, components and circuits have not been described in detail as not to unnecessarily obscure aspects of the present invention.

Embodiments of the present invention are directed to a system and method for providing cooling systems with heat exchangers that allow heat to be radiated from an integrated circuit package or surfaces of semiconductor devices. In one embodiment, a liquid based cooling unit, or a heat exchanger, is provided. The heat exchanger comprises a thermally conductive tube, over which is molded a series of thermally conductive fins and integral mounting features. The thermally conductive tube may, for example, be thermally conductive metal tube. However, other type of suitable material that allows hot liquid, air or cooling agent to flow through may also be used. The series of thermally conductive fins are the fin portion of a heat spreader. They are preferably created by insert molding, or over molding, of the thermally conductive metal tube, and are preferably made of thermally conductive plastic. The integral mounting features are utilized for mounting components of the liquid based cooling unit, and they are preferably created as part of the molding process that formed the thermally conductive fins.

Reference in the specification to "one embodiment" or "an embodiment" of the present invention means that a particular feature, structure or characteristic described in connection with the embodiment is included in at least one embodiment of the present invention. Thus, the appearances of the phrase "in one embodiment" or "according to an embodiment" appearing in various places throughout the specification are not necessarily all referring to the same embodiment.

Figure 1:
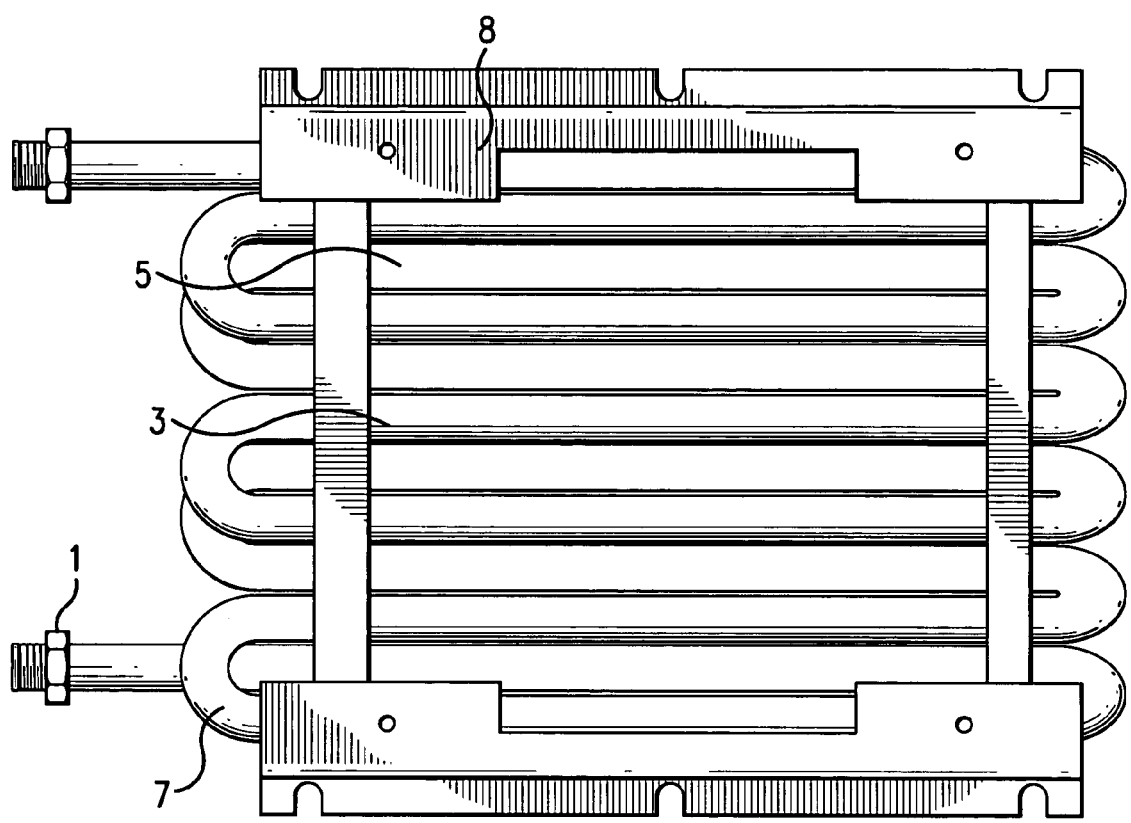
FIG. 1 shows a top view of a prior art design of a heat exchanger with metal fins in a liquid cooling system.
Figure 2:
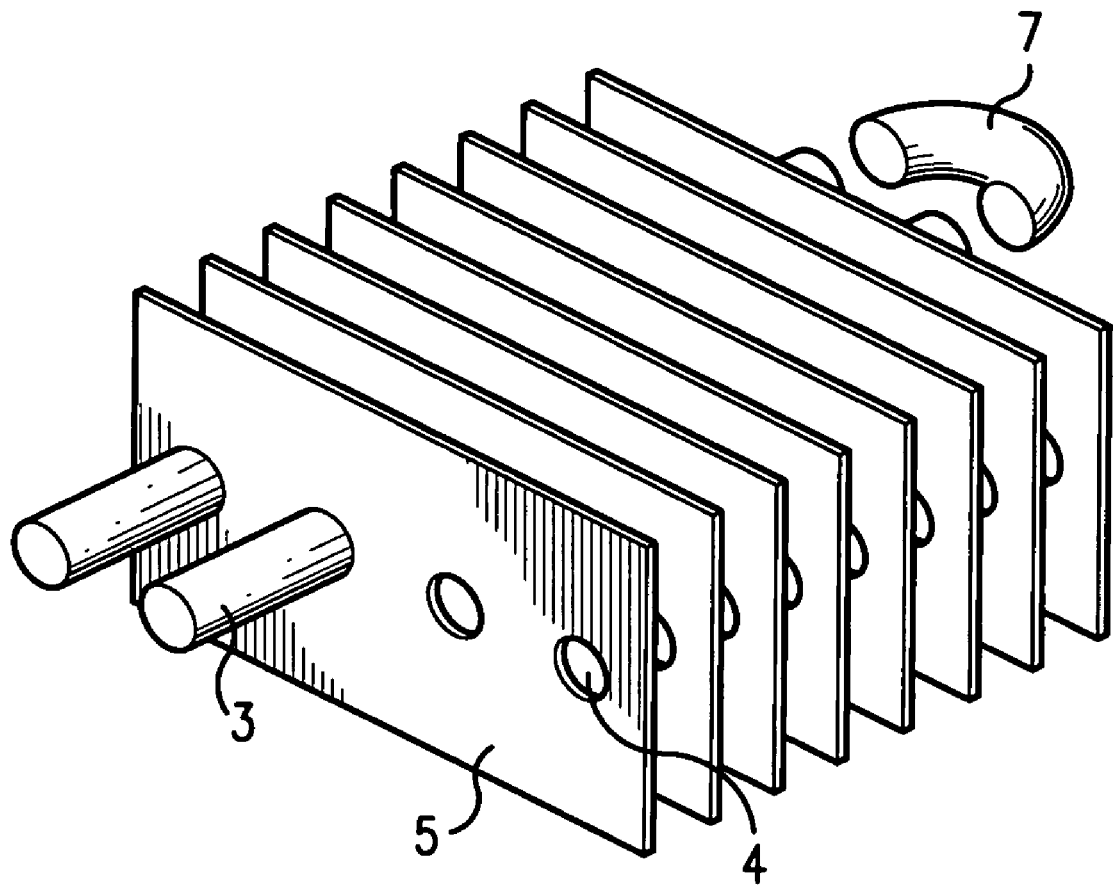
FIG. 2 illustrates a perspective view of a prior art design of a heat exchanger with metal fins in a liquid cooling system.
Figure 3:
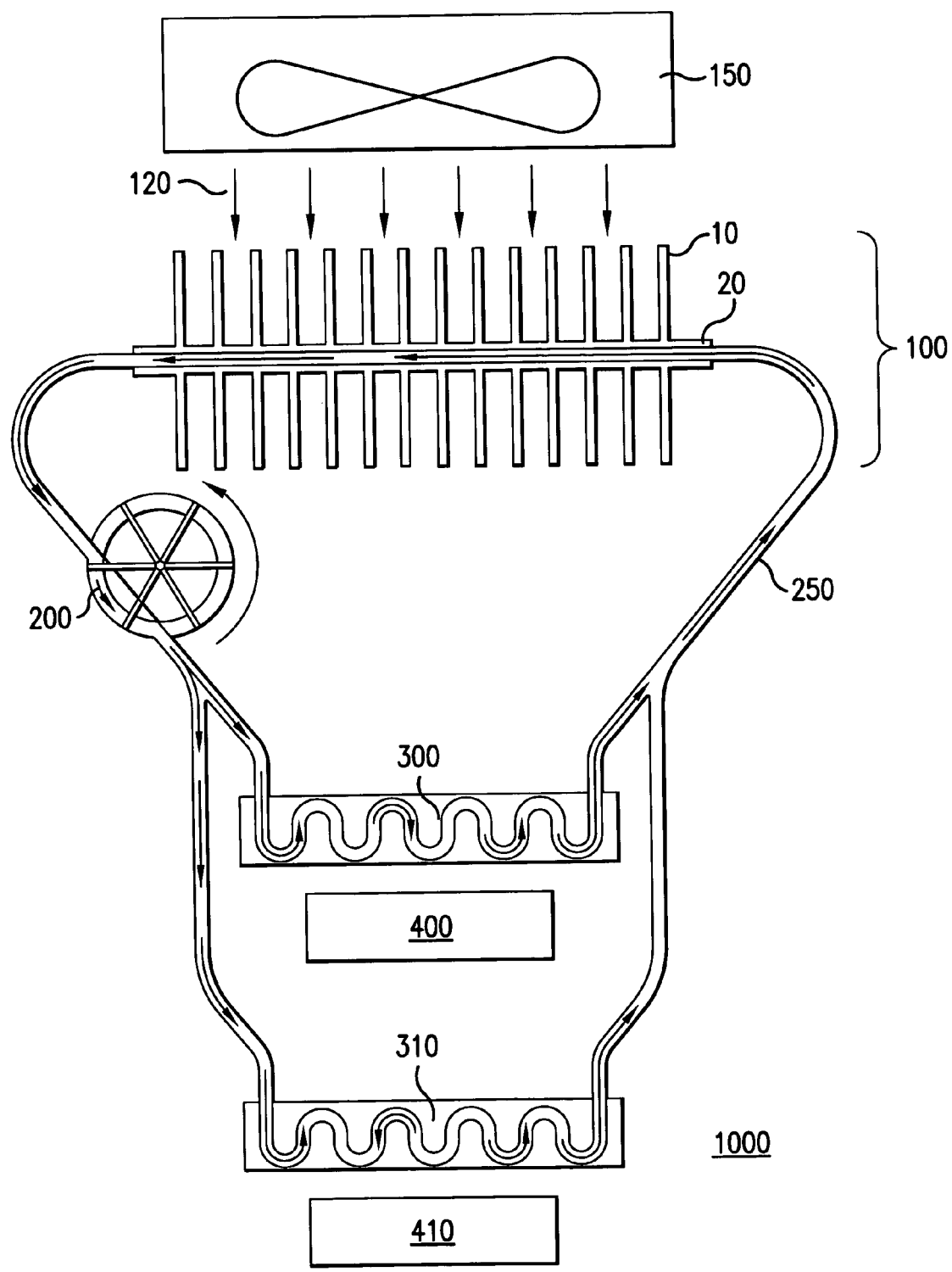
FIG. 3 shows an illustrative example of a liquid cooling system according to an embodiment of the present invention.

FIG. 3 shows an illustrative example of a liquid cooling system according to an embodiment of the present invention. In the example, the cooling system 1000 comprises a fan 150, a heat exchanger 100, tubing 250, pump 200 and cold plates 300, 310. Together, the components of the cooling system 1000 serve to cool processors 400, 410, which can be relatively hot during intensive processing. The processors 400, 410 are likely high-end processors in a computer system that has high power dissipation, which requires for liquid cooling solution. Without proper cooling, the processors 400, 410 are likely to break and cease function correctly. Although only processors 400, 410 are shown in FIG. 3, the cooling system 1000 may also be used to cool other type of devices or components that generate heat. For example, components of the cooling system 1000 may be enlarged for radiating heat from a hard disk unit or a power source used in an electronic apparatus. The cooling system 1000 may also be used to radiate heat from an integrated circuit package or the surface of a printed circuit board.

When heat is generated from one of the processors (for example, the processor 400), the heat is transferred from the processor 400 to the cold plate 300. In one embodiment, the processor 400 is directly attached to the surface of the cold plate 300. Preferably, a thin highly conductive interface film material (not shown) is interposed between the processor 400 and the cold plate 300. This interface film material may be a thin thermally conductive grease similar to, for example, Chomerics T710 and Chomerics T454. The film material provides electrically insulation between the processor 400 and the cold plate 300, while presents little thermal resistance.

As liquid coolant passes through the cold plate 300, the liquid coolant carries away with it heat transferred from the processor 400 to the cold plate 300. The liquid coolant may, for example, be a distilled water, ethylene/propylene, and glycol mixture. Other type of liquid coolant, such as water or water with mixture of ions, may also be used, as long as it serves the function of cooling. The flow of the liquid coolant through the tubing 250 and the cold plate 300 is made possible by the pump 200. In FIG. 3, the liquid coolant is shown to flow through the cold plate 300 from left to right. In other embodiments, the pump 200 may be replaced with anything that allows the liquid coolant to constantly flow through the cold plates and recycle through the cooling system 1000. Through the tubing 250, the hot liquid coolant, heated by the heat generated from the processor 400, is carried to the heat exchanger 100. The tubing 250 may be flexible or rigid. However, a flexible tubing is preferably used to connect cold plate 300 and the pump 200 to the heat exchanger 100 because a flexible tubing may be easily routed around other components inside a system in which embodiments of the liquid cooling system of the present invention operate and accommodate a greater number of chassis designs. After the hot liquid coolant flows from the tubing 250 to the heat exchanger 100, heat is dissipated to the surrounding environment through force convection at the heat exchanger 100. The force convection is in the form of air flow 120 created by, for example, the fan 150, which is directly mounted on top of the heat exchanger 100. Depending on how the heat exchanger 100 is configured or positioned, the fan 150 may also be positioned next to the heat exchanger 100. In one embodiment, the fan 150 has at least blades and a drive motor for rotating the blades to create force convection 120. In operation, the fan may also be reduced in RPM (Revolutions Per Minute) to create a quieter system. That is, the process of molding fins provides a designer with options that are not available in current fin manufacture processes. And, a more optimal design may be achieved that requires less airflow for a given heat dissipation, as compared to current heat exchangers.

In the present invention, the heat exchanger 100 is a special heat exchanger. The heat exchanger 100 comprises at least one thermally conductive tube 20 and a number of thermally conductive plastic fins 10. The tubing 250, which carries the hot liquid coolant in the direction of the heat exchanger 100, is connected to one end of the thermally conductive tube 20. The thermally conductive plastic fins 10 are integrated with the thermally conductive tube 20 by utilizing molding technique, such as insert molding, over molding or injection molding. Furthermore, the thermally conductive tube 20 is integrated with the thermally conductive plastic fins 10 in such a way that the thermally conductive tube 20 runs through the thermally conductive plastic fins 10. The thermally conductive plastic fins 10 serve to increase the contact area between the heat exchanger 100 and the force convection 120 created by the fan 150, dissipating heat more rapidly and efficiently. In the embodiment shown in FIG. 3, the liquid coolant flows through the heat exchanger 100 from right to left, with heat being dissipated to the surrounding environment through the heat exchanger 100 in the process. The cooler liquid coolant exits from the output end of the thermally conductive tube 20 into the tubing 250, where the cooler liquid coolant is then recycled back to the cold plate 300 through the pumping action created by the pump 200. The coolant is continuously circulated for continuous heat removal.

Although the cooling system 1000 shown in FIG. 3 is an indirect cooling system, in that processors do not come in contact with the coolant, the special heat exchanger 100 of the present invention may be applied to a direct system. In a direct cooling system, semiconductor devices/elements, chips or other devices come in direct contact with the coolant, making heat dissipation rather effective. To ensure heat transfer efficiency, the coolant to be used in the direct cooling system is preferably one that is not electrically conductive and does not have the property of coolant fouling due to chemical and mechanical contact. In operation, the coolant is made to flow in the cooling system through pumping action. As the coolant enters into an area containing the semiconductor devices/elements, it comes into contact with surfaces of the semiconductor devices/elements. The semiconductor devices/elements may, for example, be arranged on a substrate in the form of a plate with electrical connection members interposed therebetween. Heat is transferred from the semiconductor devices/elements as the coolant flows pass by them.

According to an embodiment of the present invention, the cold plates 300, 310 are replaced with other type of heat sink. Generally, they are thermally conductive block on which the processors 400, 410 are either directly mounted or closely positioned for heat removal. In one embodiment, instead of the thermally conductive block being in the shape of a plate with a groove(s), a channel(s) or a thermally conductive tube(s) running through it.

Figure 4:
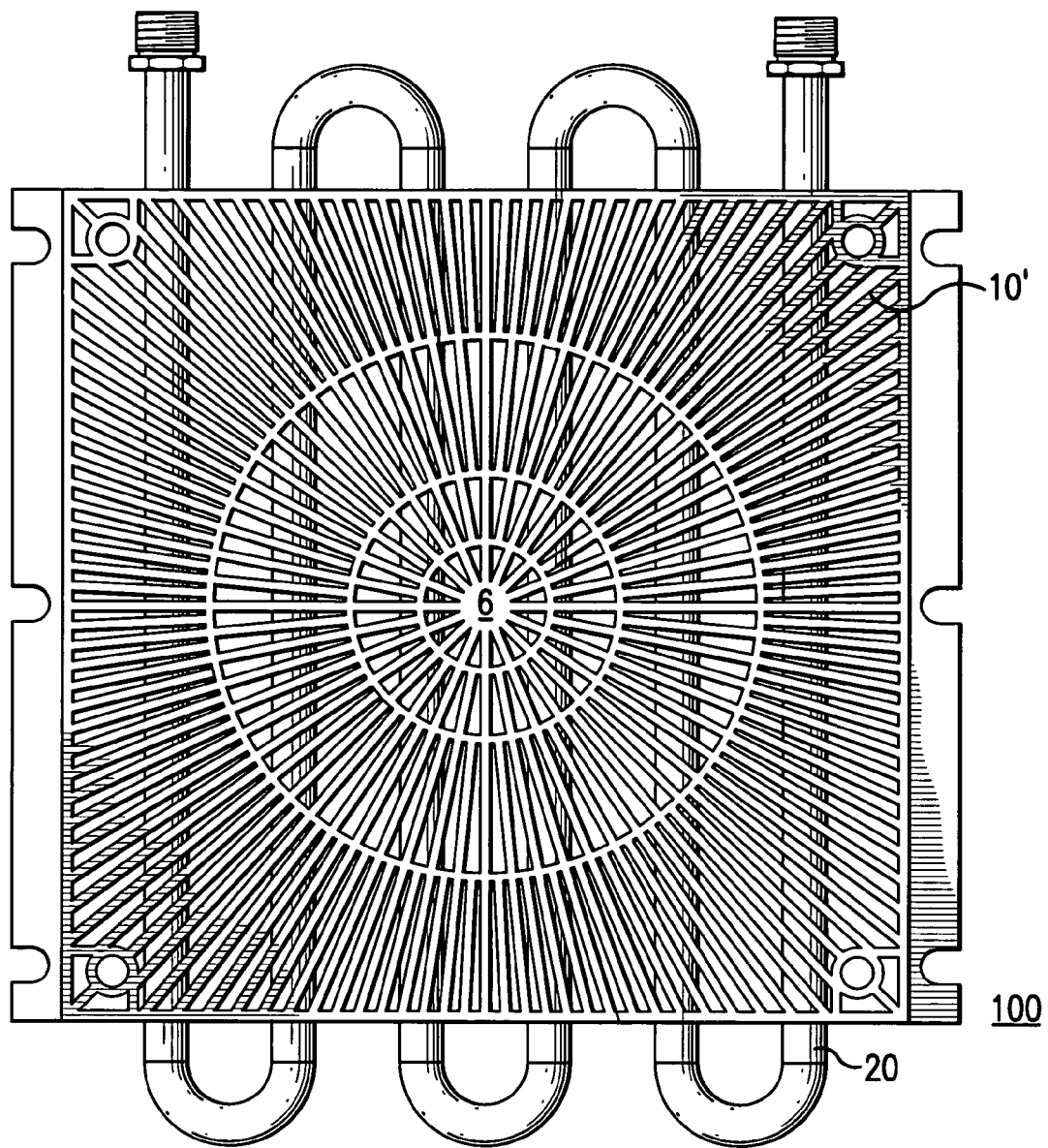
FIG. 4 shows a heat exchanger with fins in a radial pattern according to an embodiment of the present invention.
Figure 5:
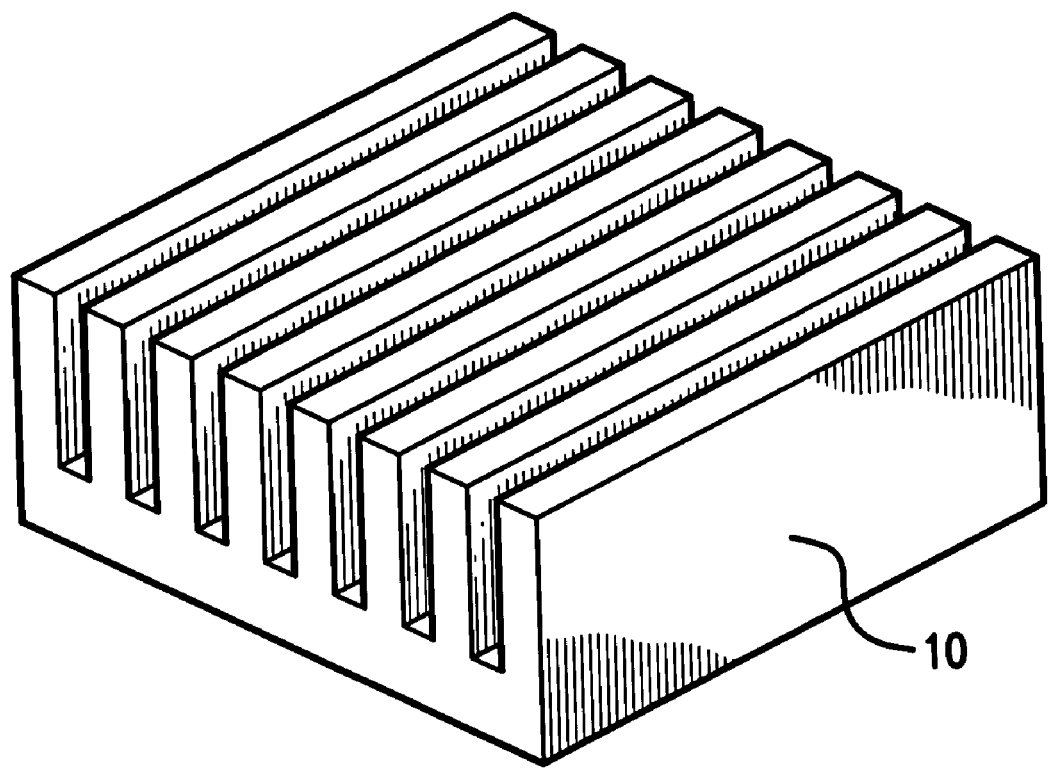
FIG. 5 shows a heat exchanger with straight fins according to an embodiment of the present invention.

FIG. 4 shows a heat exchanger with fins in a radial pattern according to an embodiment of the present invention. In the embodiment, over-molding of thermally conductive fins 10' over thermally conductive tube 20 is performed to create the radial pattern. This creates a central injection point to facilitate filling of the injection mold with the thermally conductive plastic. Preferably, the thermally conductive fins are made of plastic and the thermally conductive tube is made of metal, such as copper. However, molding material other than plastic (such as magnesium or zinc) may be used to create the thermally conductive fins, and the thermally conductive tube may be formed by other material, such as plastic, according to other embodiments of the present invention. In terms of using plastic as the main molding material for forming thermally conductive fins, several types of plastic may be used. They include, but not limited to, polyphenylene sulfide (PPS), Liquid Crystal Polymer (LCP), nylon 6/6 and polycarbonate. Of these types of plastic, LCP has the lowest viscosity, and as a result, the greatest ability to have a high percentage of thermally conductive compounds added to the resin, which means it is more conductive to heat. LCP is followed by nylon 6/6, then PPS and then polycarbonate in terms of thermal property.

In FIG. 4, the thermally conductive tube 20 is shown to include several 1800 bends that give it its periodic "U" and alternate "U" characteristics. The bends, which may also be less or more than 180° depending on specific applications, minimize the overall physical size of the thermally conductive tube 20 while maximizing surface area contact with the thermally conductive fins 10. The thermally conductive tube 20 is integrated with the thermally conductive fins 10 in such a way that the parallel portion of the thermally conductive tube 20 runs through the thermally conductive fins 10. With the periodic "U" and alternate "U" characteristics of the thermally conductive tube 20, more surface area contact is created between the thermally conductive tube 20 and the thermally conductive fins 10, allowing the maximum amount of heat to be removed from the heated coolant flowing through the thermally conductive tube 20.

According to an embodiment of the present invention as shown in FIG. 4, the radial pattern includes a solid center section 6 that provides a space for a mold's injection gate. The injection gate of a mold is where molding material enters a mold to create the radial patterned thermally conductive fins over the thermally conductive tube. The solid center section 6 is also where the hub of an attached axial fan would be located. The radial pattern has the benefit of naturally leading to the conductive particles of the molding material, such as plastic, aligning in the direction of flow—i.e., from center to radially outwards. The conductive particles may, for example, be conductive fibers that allow heat to travel the length of the fibers effectively. In one embodiment, the molten material used to form the thermally conductive fins is saturated or highly loaded with conductive fibers. Moreover, when the conductive fibers are highly oriented, as in a radial direction, it allows the thermally conductive fins to conduct better. Thus, the radial pattern provides additional strength and improved thermal conductivity in the direction of the flow.

Figure 6A:
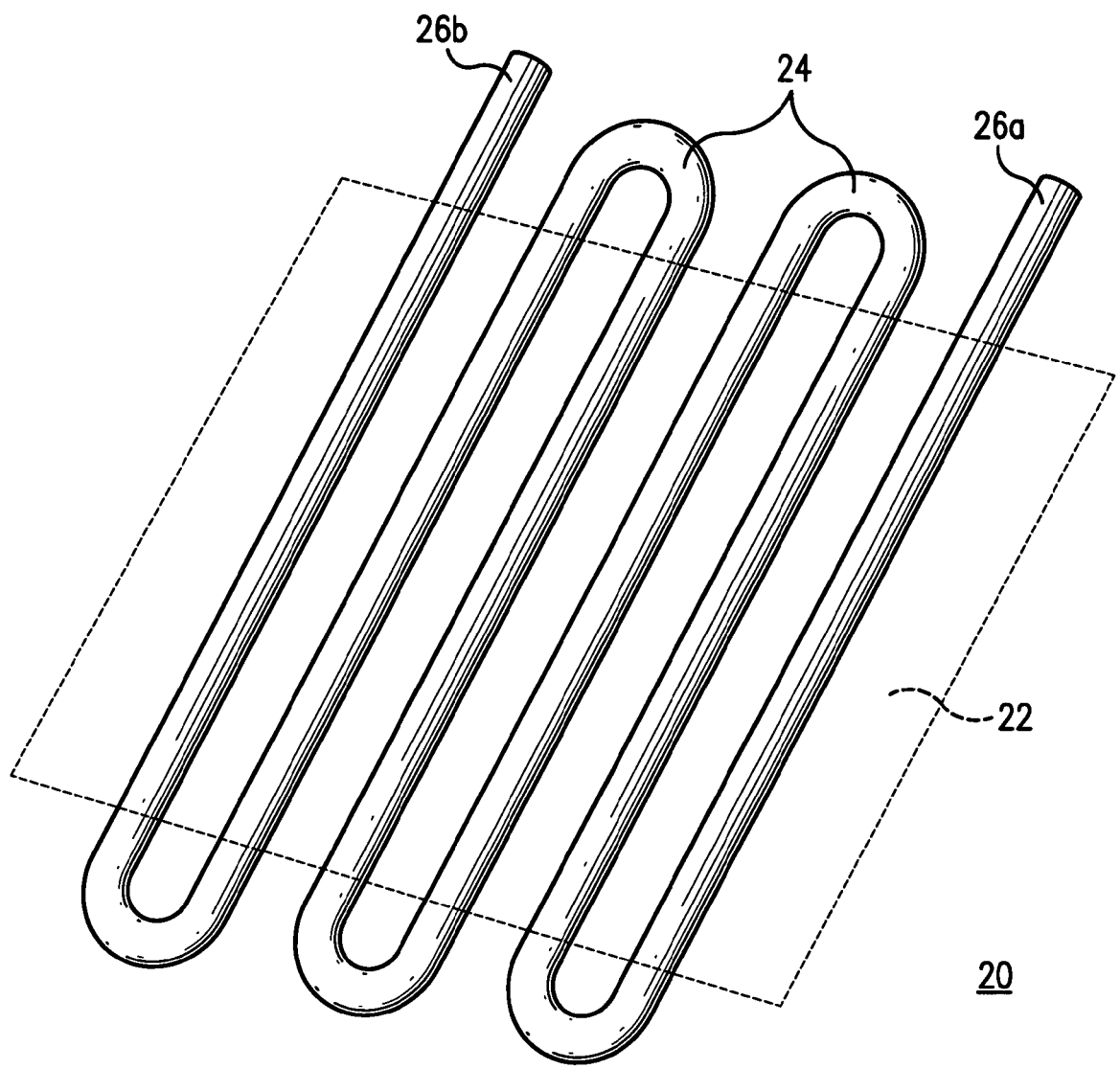
FIGS. 6(a) and 6(b) illustrate processes for providing a heat exchanger with molded thermally conductive fins according to an embodiment of the present invention.
Figure 6B:
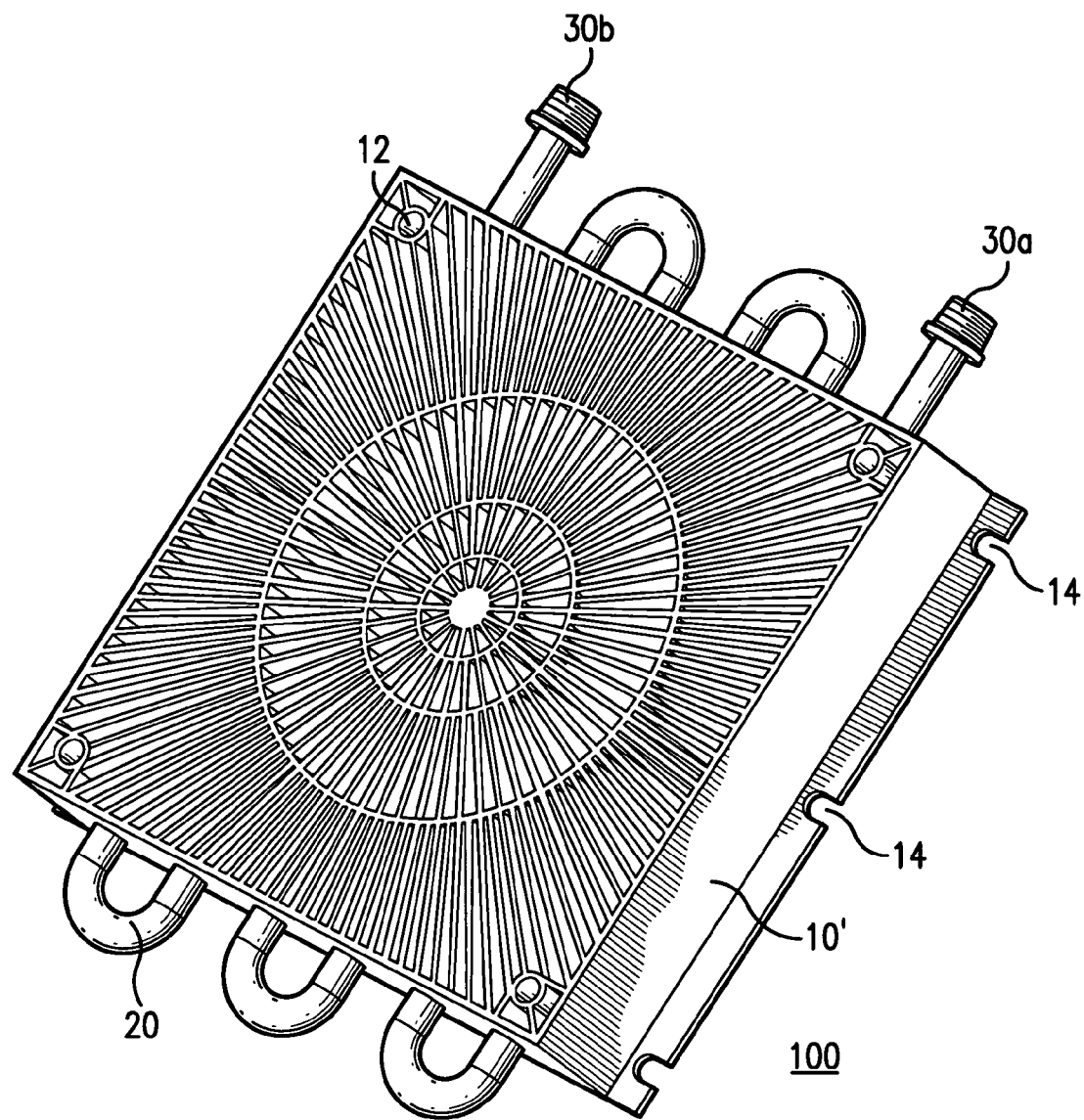

FIGS. 6(a)–6(b) illustrate processes for providing a heat exchanger with thermally conductive fins molded over thermally conductive tube according to an embodiment of the present invention. FIG. 6(a) illustrates a thermally conductive tube 20 prior to molding. The thermally conductive tube 20 comprises a parallel portion 22, bends 24 and ends 26a, 26b. The parallel portion 22 includes several tube members being parallel to each other. The bends give the thermally conductive tube 20 its periodic "U" and alternate "U" characteristics. The ends 26a, 26b are where coolant enters and exits the thermally conductive tube 20. With such construction of the parallel portion 22 and the bends 24, the thermally conductive tube 20 is able to minimize its overall physical size while maximizing surface area contact with the molded thermally conductive fins.

Once the thermally conductive tube 20 is properly formed, conventional molding equipment is utilized to mold thermally conductive fins over the tube. Injection or insert molding process may be utilized, where an article of metal or other material which is incorporated into a molded part either by pressing the insert into the finished molded part or by placing the insert in a cavity within the mold so that it becomes integral part of the molding. FIG. 6(b) shows a perspective view of a heat exchanger after molding according to an embodiment of the present invention, where pipe fittings are molded in at the same time as the thermally conductive fins. In one embodiment, the thermally conductive fins are formed from melted resin of the thermoplastic type. The molding material is fed from a hopper to a heated chamber, where the material is softened. A ram or a screw than forces the molten plastic material from the heated chamber through a sprue, runner and/or an injection gate into a cavity of the mold by means of a pressure gradient. The injection gate is preferably at the center part of the injection mold, so that resin flows from the center and radially outward. The mold usually comprises two sections held together by a clamping device with sufficient strength to withstand the pressure of the injected, molten plastic. In one embodiment, the mold has a section that fits the thermally conductive tube 20 as well as cavities that allow thermally conductive fins 10' to be formed over the thermally conductive tube 20. Pressure is maintained in the mold until the thermally conductive fins 10' have cooled and hardened sufficiently for removal from the mold.

The molding process creates thermally conductive fins 10' with intimate surface contact maintained between the fins 10' and the thermally conductive tube 20. Intimate surface contact provides a thermal conductor. It is achieved because the thermally conductive fins 10' are molded under pressure onto the thermally conductive tube 20, where additional force is generated from the molding material shrinking onto the thermally conductive tube 20 as the molding material cools and contracts. The molding process may also provide specific mounting/attaching features and other features in addition to the thermally conductive fins 10' while the fins 10' are being created. In other wards, the molding process also creates any required features simultaneously with the thermally conductive fins 10'. In one embodiment, mounting/attaching features are molded into the thermally conductive fin portion of the heat exchanger 100, so that traditional fasteners, such as brackets and screw holes, are not required to be provided. No post mold operations are necessary. Examples of the mounting/attaching features include mounting to a fan and to a chassis. The flanges/notches 14 on the outside are for mounting to the chassis. The four corner holes 12 are for mounting a fan attachment. In one embodiment, integral hose barbs 30*a*, 30*b* are further over molded onto the ends of the thermally conductive tube 20. The integral hose barbs 30*a*, 30*b* are flared or provided with ribbed nipple for securely attaching tubing 250 to the heat exchanger 100. Upon molding the fins 10' on to the thermally conductive tube 20 and the features 12, 14, 30*a*, 30*b*, the heat exchanger 100 is ready to be incorporated into a system with little labor content. This decreases cost and allows for high volume manufacturing.

Figure 7:
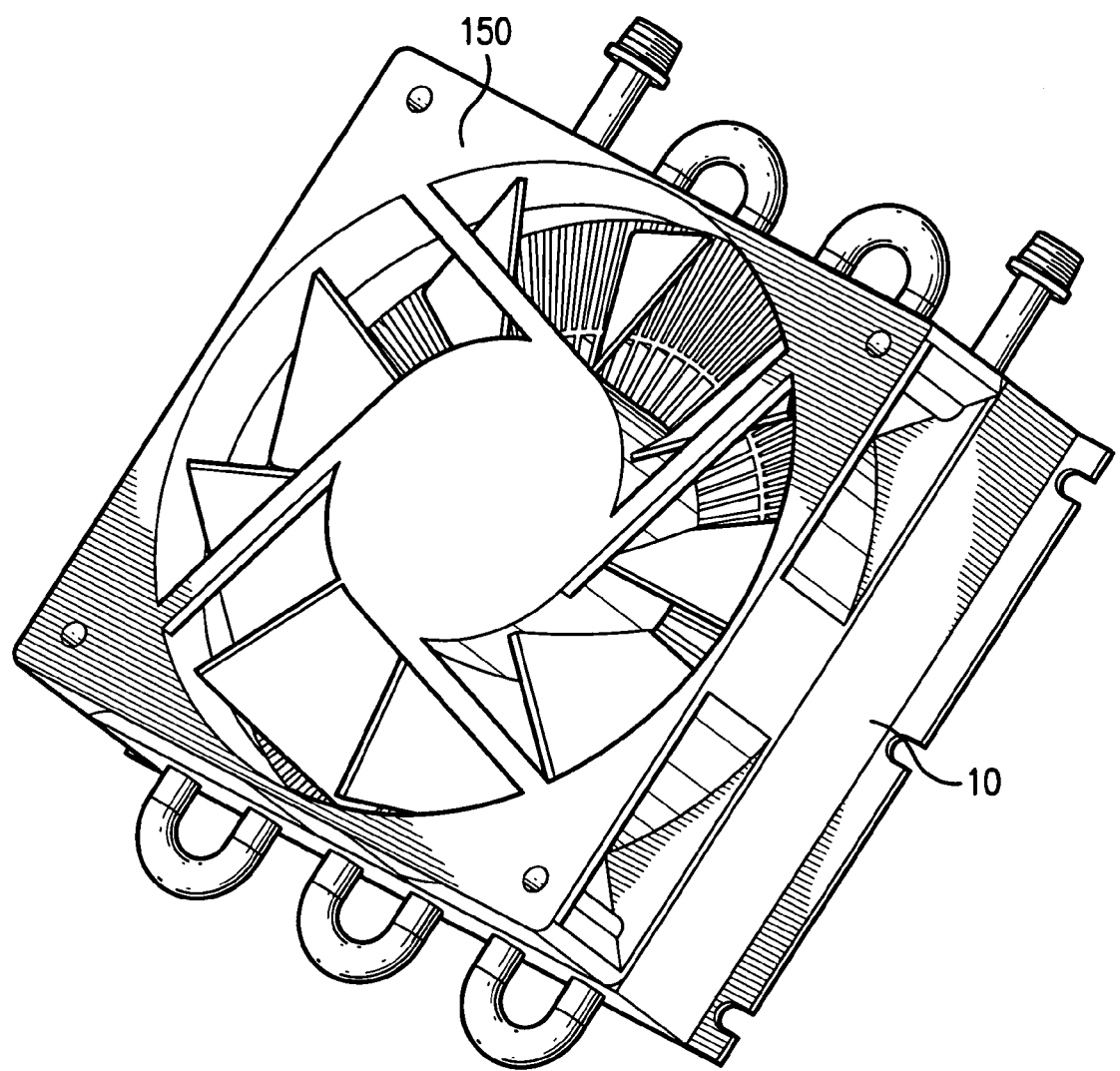
FIG. 7 shows a heat exchanger with a fan installed according to an embodiment of the present invention.

FIG. 7 shows a heat exchanger with a fan installed according to an embodiment of the present invention. A variety of fastening solutions are possible. Attaching/mounting features may be molded into the fin portion 10' of the heat exchanger in the manner described above. Traditional fasteners, such as screws, may also be used in the alternative or in combination.

Many advantages are intrinsic to the present invention providing cooling systems with heat exchangers that allow heat to be radiated from an integrated circuit package or surfaces of semiconductor devices. First, the present invention eliminates many of the production steps associated with manufacturing heat exchangers with metal fins and metal tubes. No stamping and piercing of the fin material is required. Neither tube insertion or spreading nor spacing of individual fins is necessary. No soldering or brazing is needed to configure the metal tubes or to fit the metal tubes to the metal fines. Second, the molding process utilized in the present invention creates heat spreading fins that have intimate surface contact maintained between the fins and the thermally conductive tube. Third, molding also allows any required mounting features and fittings for tubing, which may be flexible or rigid, to be created simultaneously with the thermally conductive fins. Fourth, upon insert molding the part, the heat exchanger assembly is ready to be incorporated into a cooling system with little labor content. With use of conventional molding equipment, this solution is easily scalable to high volume manufacturing. Finally, the product has the potential of being lighter weight as compared to an all-metal solution.

While the foregoing description refers to particular embodiments of the present invention, it will be understood that the particular embodiments have been presented for purposes of illustration and description. They are not intended to be exhaustive or to limit the invention to the precise forms disclosed. Many modifications and variations are possible in light of the above teachings and may be made without departing from the spirit thereof. For example, multiple heat exchangers may be stacked and water circuits put in parallel if space constraints allow such construction. The cooling system may also be used to cool any number of processors, devices, elements or surfaces. The injection gate of a mold for forming the thermally conductive fins and other features may be located away from the center of the mold. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A cooling system, comprising:
    a surface to be cooled;
    a cold plate that is in close proximity to the surface to be cooled, the cold plate acting to remove heat from the surface;
    a heat exchanger including a thermally conductive tube,
        a plurality of thermally conductive fins, formed of conductive plastic having conductive fibers, incorporated with the thermally conductive tube by one of insert molding, over molding or injection molding,
        a plurality of tubing fittings molded at the time of molding the thermally conductive fins, and
        a plurality of chassis mounting features molded into the thermally conductive fins at the time of molding the thermally conductive fins,
            wherein the thermally conductive fins have a radial pattern defining a space for a mold's injection gate at the center of the radial pattern, and wherein the plurality of conductive fibers align in a direction of center to radially outwards; and
    a fan that creates force convection to remove heat from the heat exchanger; and
    a tubing that circulates coolant between the cold plate and the heat exchanger.

2. The cooling system of claim 1, wherein the heat exchanger further comprises at least one additional mounting feature incorporated with the thermally conductive fins.

3. The cooling system of claim 1, wherein the additional mounting feature is a mounting feature for incorporating the fan.

4. The cooling system of claim 1, further including a pump connected to the tubing to pump a liquid coolant through the tubing.

5. The cooling system of claim 1, further including a thin, highly thermally conductive grease interposed between the surface to be cooled and the cold plate.

6. The cooling system of claim 1, wherein the tubing is flexible.

7. The cooling system of claim 1, wherein the tubing passes through the cold plate.

* * * * *